United States Patent
Lin et al.

(10) Patent No.: US 10,116,276 B2
(45) Date of Patent: Oct. 30, 2018

(54) POWER AMPLIFIER CIRCUIT

(71) Applicant: National Chi Nan University, Puli, Nantou (TW)

(72) Inventors: Yo-Sheng Lin, Nantou (TW); Chien-Chin Wang, Nantou (TW)

(73) Assignee: National Chi Nan University, Puli, Nantou (TW)

( * ) Notice: Subject to any disclaimer, the term of this patent is extended or adjusted under 35 U.S.C. 154(b) by 21 days.

(21) Appl. No.: 15/355,451

(22) Filed: Nov. 18, 2016

(65) Prior Publication Data

US 2017/0346458 A1 Nov. 30, 2017

(30) Foreign Application Priority Data

May 26, 2016 (TW) .............................. 105116390 A

(51) Int. Cl.
| | |
|---|---|
| *H01P 5/12* | (2006.01) |
| *H03F 3/60* | (2006.01) |
| *H03F 3/195* | (2006.01) |
| *H03F 3/213* | (2006.01) |
| *H03F 1/56* | (2006.01) |

(52) U.S. Cl.
CPC .............. *H03F 3/604* (2013.01); *H03F 1/56* (2013.01); *H03F 3/195* (2013.01); *H03F 3/213* (2013.01); *H03F 2200/255* (2013.01); *H03F 2200/423* (2013.01); *H03F 2200/451* (2013.01)

(58) Field of Classification Search
CPC .......... H03F 3/604; H03F 3/195; H03F 3/213; H03F 1/56; H03F 2200/255; H03F 2200/423; H03F 2200/451
See application file for complete search history.

(56) References Cited

U.S. PATENT DOCUMENTS

2015/0365052 A1* 12/2015 Barton ..................... H03F 1/56
330/295

* cited by examiner

*Primary Examiner* — Robert J Pascal
*Assistant Examiner* — Kimberly Glenn
(74) *Attorney, Agent, or Firm* — Merchant & Gould P.C.

(57) ABSTRACT

An RF power amplifier circuit includes a power divider, multiple power amplification circuits and a power combiner that cooperatively perform power amplification on an RF input signal so as to output an RF output signal, and an impedance conversion circuit that has a circuit terminal coupled to one of the power divider and the power combiner which has a microstrip structure, and that is configured such that a conversion impedance, which is an impedance seen into the impedance conversion circuit from the circuit terminal, matches an impedance seen into the power divider or the power combiner from the circuit terminal. The microstrip structure has a physical length associated with the conversion impedance.

12 Claims, 8 Drawing Sheets

POWER AMPLIFIER CIRCUIT

CROSS-REFERENCE TO RELATED APPLICATION

This application claims priority of Taiwanese Patent Application No. 105116390, filed on May 26, 2016.

FIELD

The disclosure relates to a power amplifier circuit, and more particularly to an N-way power amplifier circuit.

BACKGROUND

Referring to FIG. 1, a conventional 4-way radio frequency (RF) power amplifier circuit includes three Wilkinson power dividers 11, 12, six power amplification circuits 15, 16, and three Wilkinson power combiners 13, 14.

Further referring to FIG. 2, the Wilkinson power divider 11 includes an input line 111 receiving an RF input signal (Pi) that has a wavelength of λ, two quarter wave lines 112, 113, a resistor 116, and two output lines 114, 115. An input impedance ($Z_{111}$) seen into the input line 111 is equal to an output impedance ($Z_{114}$, $Z_{114}$) seen into each of the output lines 114, 115, where $Z_0$=50 ohms. The quarter wave lines 112, 113 have a length of λ/4 and are Y-shaped, thereby dividing the RF input signal (Pi) into two first RF division signals (P1). The output lines 114, 115 are respectively coupled to the quarter wave lines 112, 113 to output the first RF division signals (P1). The resistor 116 is coupled between the quarter wave lines 112, 113 to enhance isolation and prevent the first RF division signals (P1) from interfering with each other.

The power amplification circuits 15 respectively receive the first RF division signals (P1), perform power amplification on the first RF division signals (P1), and output first RF amplification signals (P2) to the Wilkinson power dividers 12.

Similarly, the Wilkinson power dividers 12, which are configured to be the same as the Wilkinson power divider 11, divide the first RF amplification signals (P2) into four second RF division signals (P3), and the power amplification circuits 16 perform power amplification on the second RF division signals (P3), and output four second RF amplification signals (P4).

The Wilkinson power combiners 13, 14 are configured to be the same as the Wilkinson power divider 11, but are used in a reverse way. Accordingly, taken the upper one of the Wilkinson power combiner 13 as an example, the input impedances ($Z_{131}$, $Z_{132}$) thereof are both 50 ohms, and an output impedance thereof ($Z_{133}$) is also 50 ohms. Each of the Wilkinson power combiners 13 receives and combines two of the second RF amplification signals (P4) into an RF combination signal (P5). Then, the Wilkinson power combiner 14 receives and combines the first RF combination signals (P5) into an RF output signal (Po).

Such a conventional RF power amplifier circuit has at least the following drawbacks:

1. Large chip area is required: Since each of the Wilkinson power dividers 11, 12 and the Wilkinson power combiners 13, 14 has the quarter wave lines each having a length of λ/4 (i.e., an electrical length of 90°), the overall layout length would be approximately 4×λ/4, which may occupy a large chip area.

2. Power gain and power-added efficiency (PAE) are reduced: The large area of the Wilkinson power dividers 11, 12 and the Wilkinson power combiners 13, 14 may result in higher signal loss, so the power gain between the RF output signal (Po) and the RF input signal (Pi) is reduced, further reducing the PAE.

SUMMARY

Therefore, an object of the disclosure is to provide an RF power amplifier circuit that can alleviate at least one of the drawbacks of the prior art.

According to the disclosure, the RF power amplifier circuit includes a power divider, a plurality of power amplification circuits, a power combiner, and a first impedance conversion circuit. The power divider is disposed to receive an RF input signal, and is configured to divide the RF input signal into more than three RF division signals. The power amplification circuits are coupled to the power divider for respectively receiving the RF division signals. Each of the power amplification circuits is configured to perform power amplification on a respective one of the RF division signals, and to output a respective one of amplified RF division signal. The power combiner is coupled to the power amplification circuits for receiving the amplified RF division signals, and is configured to combine the amplified RF division signals into an RF output signal. One of the power divider and the power combiner has a first microstrip structure. The first impedance conversion circuit has a first terminal coupled to the one of the power divider and the power combiner that has the first microstrip structure, and a second terminal that is disposed to receive the RF input signal when the first terminal is coupled to the power divider, and that is disposed to output the RF output signal when the first terminal is coupled to the power combiner. The first impedance conversion circuit is configured to permit transmission of one of the RF input signal and the RF output signal between the first and second terminals thereof, and is configured such that a first conversion impedance, which is an impedance seen into the first impedance conversion circuit from the first terminal, matches an impedance seen into the one of the power divider and the power combiner from the first terminal. The first microstrip structure has a physical length associated with the first conversion impedance.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
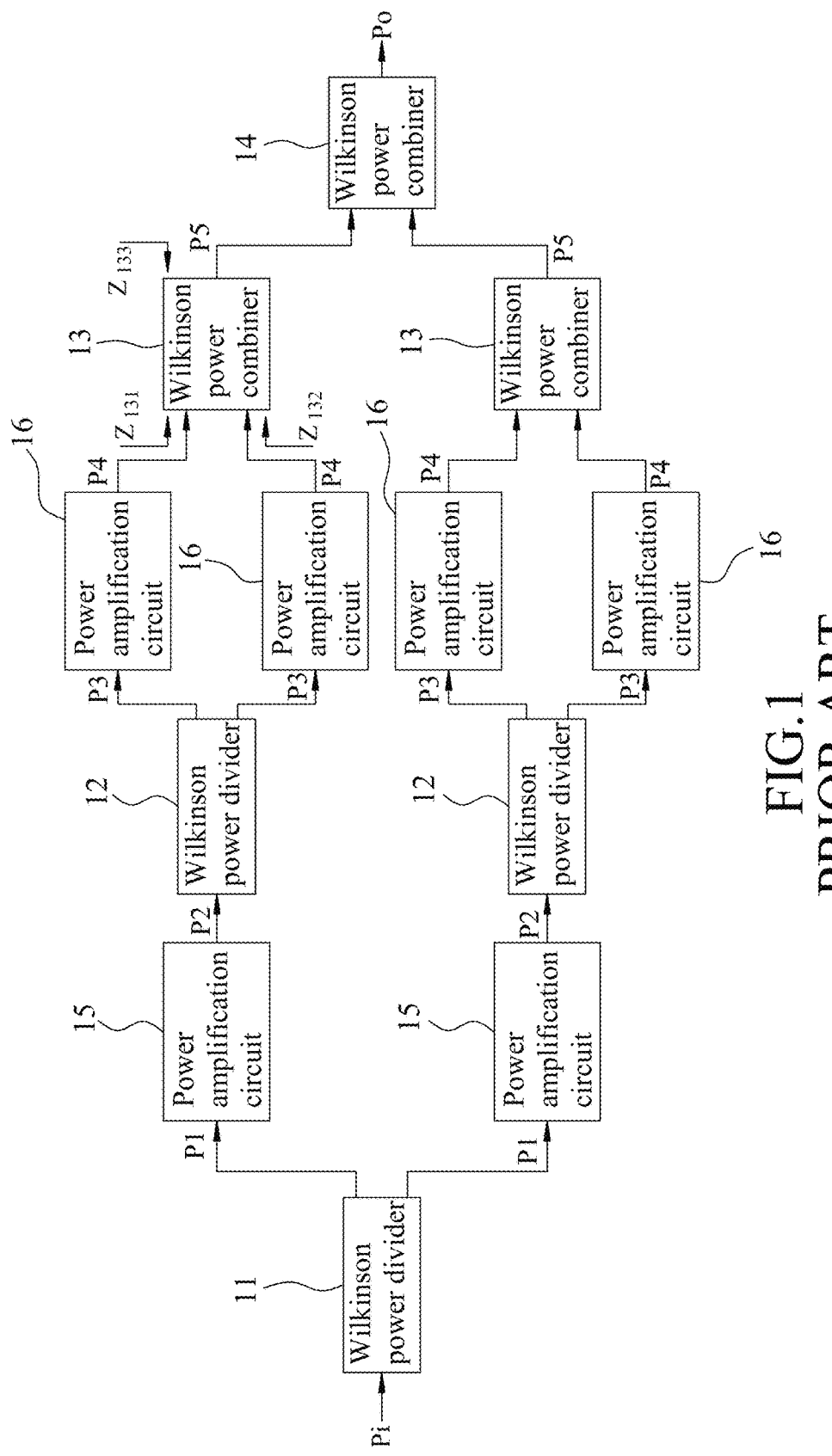
FIG. 1 is a block diagram illustrating a conventional 4-way RF power amplifier circuit.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
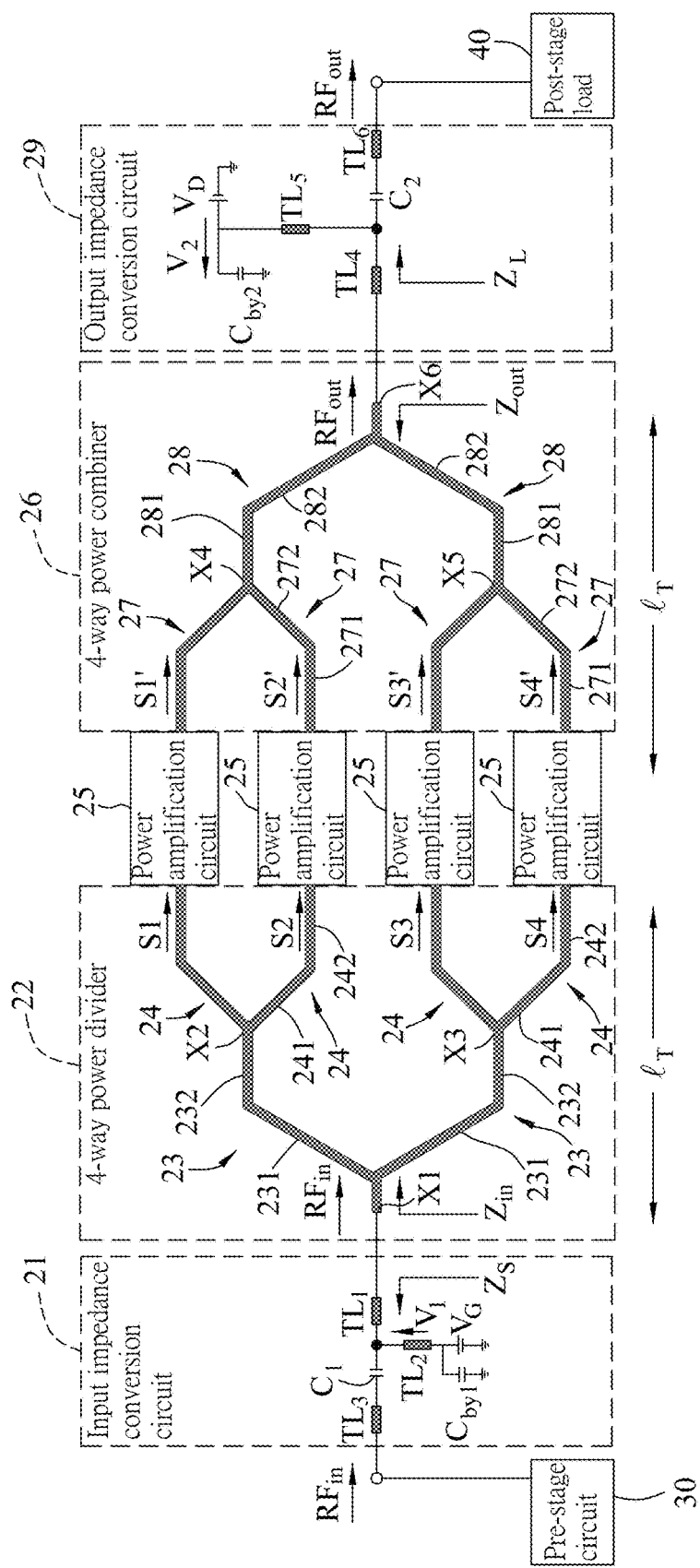
FIG. 3 is a circuit block diagram illustrating an embodiment of an RF power amplifier circuit according to this disclosure.

Referring to FIG. 3, an embodiment of an N-way RF power amplifier circuit according to this disclosure is configured to receive and amplify an RF input signal ($RF_{in}$) from a pre-stage circuit 30 and to output an RF output signal ($RF_{out}$) to a post-stage load 40. In practice, the N-way RF power amplifier circuit may be applied in a transceiver of a communication system, in which the pre-stage circuit 30 may be a mixer or another power amplifier, and the post-stage load 40 may be an antenna.

The N-way RF power amplifier circuit includes an input impedance conversion circuit 21, an N-way power divider 22, a number N of power amplification circuits 25, an N-way power combiner 26 and an output impedance conversion circuit 29, where N≥4. In this embodiment, N=4.

The input impedance conversion circuit 21 has a first terminal, which is an output terminal, coupled to the power divider 22, and a second terminal, which is an input terminal, coupled to the pre-stage circuit 30 for receiving therefrom the RF input signal ($RF_{in}$). The input impedance conversion circuit 21 is configured to permit transmission of the RF input signal ($RF_{in}$) between the first and second terminals thereof, and to perform impedance conversion on an impedance of the pre-stage circuit 30 such that a conversion impedance of the input impedance conversion circuit 21, which is a source impedance ($Z_S$) seen into the input impedance conversion circuit 21 from the first terminal of the input impedance conversion circuit 21, matches an input impedance ($Z_{in}$) seen into a microstrip input terminal (X1) of the power divider 22 from the first terminal of the input impedance conversion circuit 21. In this embodiment, the impedance matching refers to conjugate matching between impedances, for example, $Z_{in}=Z_S^*$.

In this embodiment, the input impedance conversion circuit 21 includes microstrip lines ($TL_1$), ($TL_2$), ($TL_3$), a capacitor ($C_1$) and a bypass capacitor ($C_{by1}$). The microstrip line ($TL_1$) has a first terminal serving as the first terminal (i.e., output terminal) of the input impedance conversion circuit 21, and a second terminal. Generally, the microstrip lines are designed to have a characteristic impedance of 50 ohms for impedance matching with the pre-stage circuit 30. In a case of 90 nm CMOS process, the microstrip lines have a corresponding width of 7 μm. The microstrip line ($TL_2$) has a first terminal coupled to the second terminal of the microstrip line ($TL_1$), and a second terminal coupled to a first bias voltage source ($V_G$) for receiving therefrom a first voltage ($V_1$). The bypass capacitor ($C_{by1}$) is coupled to the first bias voltage source ($V_G$) in parallel by coupling the second terminal of the microstrip line ($TL_2$) to a reference node (e.g., ground). In integrated circuit (IC) layout, the first bias voltage source ($V_G$) provides the first voltage ($V_1$) to each of the power amplification circuits 25, and such may be realized by inputting the first voltage ($V_1$) through a test pad. The use of the by-pass capacitor ($C_{by1}$) may prevent parasitic effects resulting from the test pad, thereby ensuring that the first bias voltage source ($V_G$) is equivalent to ground in the operating frequency band. The microstrip line ($TL_3$) and the capacitor ($C_1$) are coupled in series to form a series connection that has a first terminal coupled to the second terminal of the microstrip line ($TL_1$), and a second terminal serving as the second terminal (i.e., input terminal) of the first impedance conversion circuit 21. In this case, the source impedance ($Z_S$) may be expressed as $$Z_S = j\omega L_{TL1} + \left[\left(j\omega L_{TL2} + \frac{1}{j\omega C_{by1}}\right)\middle\|\left(\frac{1}{j\omega C_1} + j\omega L_{TL3} + R_{0S}\right)\right] \quad (1)$$

where parameters are defined as follows:
ω: an angular frequency of the RF input signal ($RF_{in}$) or the RF output signal ($RF_{out}$),
$L_{TL1}$: inductance of the microstrip line ($TL_1$),
$L_{TL2}$: inductance of the microstrip line ($TL_2$),
$L_{TL3}$: inductance of the microstrip line ($TL_3$),
$C_1$: capacitance of the capacitor ($C_1$),
$C_{by1}$: capacitance of the bypass capacitor ($C_{by1}$), and
$R_{0S}$: impedance of the pre-stage circuit 30 (e.g., 50 ohms).

It is noted that the capacitors ($C_1$), ($C_{by1}$) are selected such that $$\frac{1}{\omega C_{by1}} \approx 0 \text{ and } \frac{1}{\omega C_1} \approx 0,$$

so equation (1) may be rewritten as $$Z_S \approx R_{0S} \frac{\omega^2 L_{TL2}^2}{R_{0s}^2 + \omega^2(L_{TL2}+L_{TL3})^2} + \quad (2)$$
$$j\omega\left[L_{TL1} + \frac{R_{0s}^2 L_{TL2} + \omega^2 L_{TL2}L_{TL3}(L_{TL2}+L_{TL3})}{R_{0s}^2 + \omega^2(L_{TL2}+L_{TL3})^2}\right] \equiv R_S + j\omega L_S$$

where $R_S$ serves as a resistance that represents a real part of the source impedance ($Z_S$), and $L_S$ serves as an inductance that represents an imaginary part of the source impedance ($Z_S$).

The power divider 22 receives the RF input signal ($RF_{in}$) from the input impedance conversion circuit 21 through the microstrip input terminal (X1) thereof, and divides the RF input signal ($RF_{in}$) into a number N of RF division signals. The power divider 22 is fabricated in a form of a microstrip structure that has a physical length ($l_T$) associated with the source impedance ($Z_S$). In a case where N=$2^R$ (R is a positive integer greater than or equal to 2), the microstrip structure of the power divider 22 includes the microstrip input terminal (X1), and a number R of microstrip line groups that are respectively first to $R^{th}$ microstrip line groups. The first microstrip line group includes a pair of microstrip lines each having a first terminal, and a second terminal which is coupled to the microstrip input terminal (X1). The $r^{th}$ (r is a positive integer greater than one and smaller than R) microstrip line group includes $2r^{-1}$ pairs of $r^{th}$ microstrip lines. Each pair of the $r^{th}$ microstrip lines corresponds to a respective one of the $(r-1)^{th}$ microstrip lines, and each of the $r^{th}$ microstrip lines has a first terminal, and a second terminal that is coupled to the first terminal of the corresponding one of the $(r-1)^{th}$ microstrip lines. The $R^{th}$ microstrip line group includes a number $2^{R-1}$ pairs of $R^{th}$ microstrip lines. Each pair of said $R^{th}$ microstrip lines corresponds to a respective one of the $(R-1)^{th}$ microstrip lines, and each of the $R^{th}$ microstrip lines has a first terminal that is coupled to a respective one of the power amplification circuits 25, and a second terminal that is coupled to the first terminal of the corresponding one of the $(R-1)^{th}$ microstrip lines. The first terminal of each of the $R^{th}$ microstrip lines is disposed to transmit a respective one of the RF division signals to the respective one of the power amplification circuits 25.

In the embodiment depicted in FIG. 3 where N=4 and R=2, the power divider 22 receives the RF input signal ($RF_{in}$) from the input impedance conversion circuit 21 through the microstrip input terminal (X1) thereof, and divides the RF input signal ($RF_{in}$) into four RF division signals (S1-S4). The microstrip structure of the power divider 22 includes the microstrip input terminal (X1) coupled to the first terminal of the input impedance conversion circuit 21, a first microstrip line group and a second microstrip line group. The first microstrip line group includes a pair of microstrip lines 23 each having a first terminal, and a second terminal that is coupled to the first terminal of the input impedance conversion circuit 21 through the microstrip input terminal (X1). In other words, the second terminals of the microstrip lines 23 are both coupled to the microstrip input terminal (X1). The second microstrip line group includes two pairs of microstrip lines 24. Each pair of the microstrip lines 24 corresponds to a respective one of the microstrip lines 23, and each of the microstrip lines 24 has a first terminal that is coupled to a respective one of the power amplification circuits 25, and a second terminal that is coupled to the first terminal of the corresponding one of the microstrip lines 23. The first terminal of each of the microstrip lines 24 is disposed to transmit a respective one of the RF division signals (S1-S4) to the respective one of the power amplification circuits 25.

In this embodiment, the microstrip structure of the power divider 22 is symmetrical with respect to a lengthwise direction of the microstrip input terminal (X1). Each of the microstrip lines 23 has a first segment 231 and a second segment 232. The first segment 231 of each microstrip line 23 extends from an end of the microstrip input terminal (X1), and forms an angle with the lengthwise direction of the microstrip input terminal (X1). The second segment 232 of each microstrip line 23 extends from an end of a corresponding first segment 231 (of the same microstrip line 23) in parallel to the lengthwise direction of the microstrip input terminal (X1), forms an angle with the corresponding first segment 231, and has an end terminal (X2, X3).

Similarly, each pair of the microstrip lines 24 is symmetrical with respect to the second segment 232 of the corresponding microstrip line 23. Each of the microstrip lines 24 has a first segment 241 and a second segment 242. The first segment 241 of each microstrip line 24 extends from the end terminal (X2, X3) of the corresponding microstrip line 23, and forms an angle with the lengthwise direction of the second segment 232 of the corresponding microstrip line 23. The second segment 242 of each microstrip line 24 extends from an end of a corresponding first segment 241 (of the same microstrip line 24) in parallel to the lengthwise direction of the second segment 232 of the corresponding microstrip line 23, forms an angle with the corresponding first segment 241, and has an end terminal coupled to the corresponding power amplification circuit 25 for providing the respective RF division signal (S1, S2, S3, S4) thereto. It is noted that configuration of the microstrip structure is not limited to such.

In this embodiment, the physical length ($l_T$) is associated with the source impedance ($Z_S$), and a magnitude of the source impedance ($Z_S$) is designed such that the physical length ($l_T$) is much shorter than that when using the Wilkinson power dividers each having a physical length of $\lambda/4$, where $\lambda$ represents a wavelength of the RF input signal ($RF_{in}$).

Figure 4:
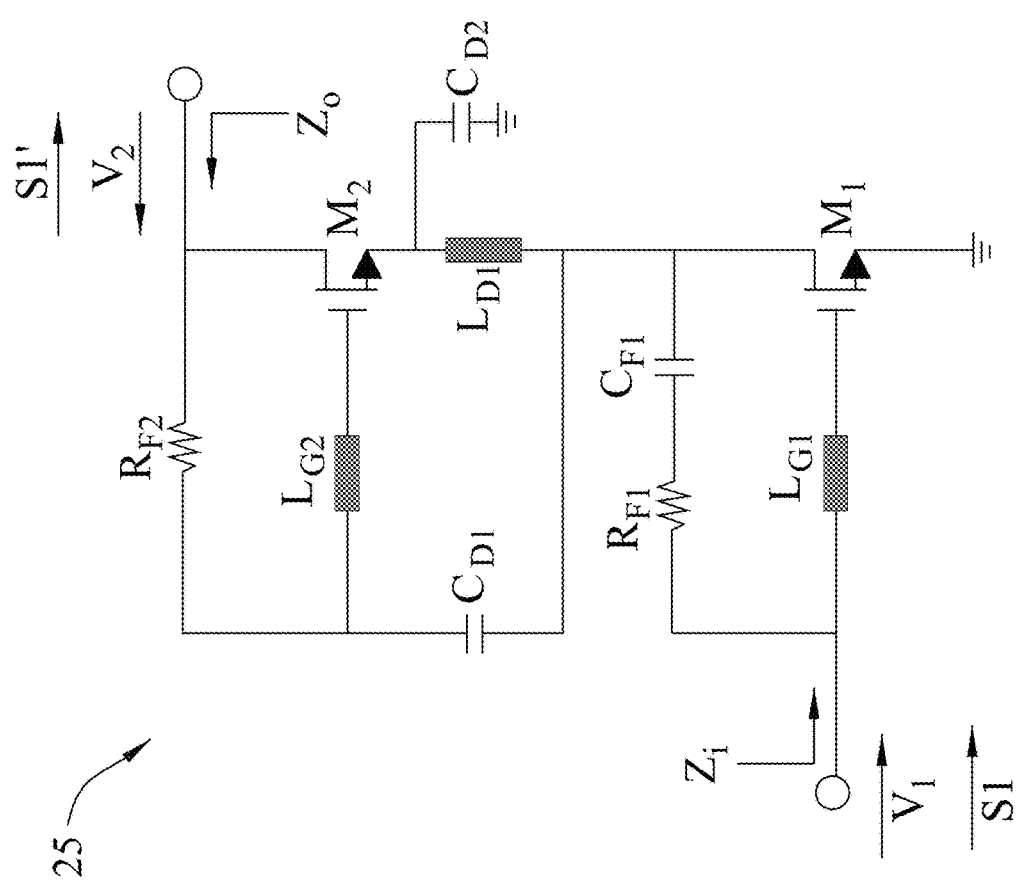
FIG. 4 is a schematic circuit diagram illustrating a power amplification circuit of the embodiment.

Referring to FIGS. 3 and 4, the power amplification circuits 25 are respectively coupled to the end terminals of the second segments 242 of the microstrip lines 24 of the power divider 22 for respectively receiving therefrom the RF division signals (S1-S4). Each of the power amplification circuits 25 is configured to perform power amplification on the respective one of the RF division signals (S1-S4) so as to output a respective one of amplified RF division signals (S1', S2', S3', S4'), and includes two transistors ($M_1$, $M_2$), three inductors ($L_{G1}$, $L_{G2}$, $L_{D1}$), three capacitors ($C_{D1}$, $C_{D2}$, $C_{F1}$) and two resistors ($R_{F1}$, $R_{F2}$).

The transistor ($M_1$) has a first terminal, a second terminal coupled to the reference node, and a control terminal. The inductor ($L_{G1}$) has a first terminal coupled to the power divider 22 for receiving therefrom a corresponding RF division signal (e.g., S1), and a second terminal coupled to the control terminal of the transistor ($M_1$). The resistor ($R_{F1}$) and the capacitor ($C_{F1}$) are coupled in series between the first terminals of the inductor ($L_{G1}$) and the transistor ($M_1$). The transistor ($M_2$) has a first terminal coupled to the power combiner 26 for providing thereto a corresponding one of the amplified RF division signals (e.g., S1'), a second terminal, and a control terminal. The inductor ($L_{G2}$) has a first terminal, and a second terminal coupled to the control terminal of the transistor ($M_2$). The capacitor ($C_{D1}$) is coupled between the first terminals of the inductor ($L_{G2}$) and the transistor ($M_1$). The inductor ($L_{D1}$) is coupled between the first terminal of the transistor ($M_1$) and the second terminal of the transistor (M2). The resistor ($R_{F2}$) is coupled between the first terminals of the inductor ($L_{G2}$) and the transistor (M2). The capacitor ($C_{D2}$) is coupled between the second terminal of the transistor ($M_2$) and the reference node. In this embodiment, each of the transistors ($M_1$, $M_2$) is an N-type metal-oxide-semiconductor field effect transistor (MOSFET) having a drain terminal, a source terminal and a gate terminal that respectively serve as the first, second and control terminals thereof, but the disclosure is not limited thereto. In this case, an input impedance ($Z_i$) of the power amplification circuit 25 is determined by the resistor ($R_{F1}$), the capacitor ($C_{F1}$) and the inductor ($L_{G1}$), and may be seen as an equivalent parallel RC circuit; and an output impedance ($Z_o$) of the power amplification circuit 25 is determined by the resistor ($R_{F2}$), the capacitor ($C_{D1}$) and the inductors ($L_{G2}$, $L_{D1}$), and may be seen as an equivalent parallel RC circuit.

In this embodiment, by virtue of the transistors ($M_1$, $M_2$) forming a current-reuse structure, individual biasing is not required, and the first voltage ($V_1$) that comes from the input impedance conversion circuit 21, and a second voltage ($V_2$) that comes from the output impedance conversion circuit 29 may cooperatively provide biasing to both the transistors ($M_1$, $M_2$) at the same time, leading to a relatively simpler circuit structure. If individual biasing is provided for the transistors ($M_1$, $M_2$), resultant two individual current flows may lead to greater power consumption. On the other hand, since the transistors ($M_1$, $M_2$) share the same current that flows from the first terminal of the transistor ($M_2$) to the reference node, power consumption of each power amplification circuit 25 may be reduced.

Referring to FIG. 3 again, the power combiner 26 is coupled to the power amplification circuits 25 for receiving the amplified RF division signals (S1'-S4'), and is configured to combine the amplified RF division signals (S1'-S4') into the RF output signal ($RF_{out}$). In this embodiment, the power combiner 26 is fabricated in a form of a microstrip structure that has a physical length ($l_T$).

The output impedance conversion circuit 29 has a first terminal coupled to the power combiner 26 for receiving therefrom the RF output signal ($RF_{out}$), and a second terminal coupled to the post-stage load 40 for transmitting thereto the RF output signal ($RF_{out}$). The output impedance conversion circuit 29 is configured to permit transmission of the RF output signal ($RF_{out}$) between the first and second terminals thereof, and to perform impedance conversion on an impedance of the post-stage load 40 such that a conversion impedance ($Z_L$) of the output impedance conversion circuit 29, which is an impedance seen into the output impedance conversion circuit 29 from the first terminal of the output impedance conversion circuit 29, matches an output impedance ($Z_{out}$) seen into a microstrip output terminal (X6) of the power combiner 26 from the first terminal of the output impedance conversion circuit 29. The physical length ($l_T$) of the microstrip structure of the power combiner 26 is associated with the conversion impedance ($Z_L$).

It is noted that, in this embodiment, the circuit structure of the power combiner 26 and the output impedance conversion circuit 29 is the same as that of the power divider 22 and the input impedance conversion circuit 21, but is used in a reverse way. However, the disclosure is not limited to such. It is further noted that even if the circuit structures are the same, parameters of corresponding circuit elements, such as impedance values, may either be the same or different on a case by case basis. Accordingly, detailed descriptions of the power combiner 26 and the output impedance conversion circuit 29 are omitted herein for the sake of brevity, while in FIG. 3, the reference numerals $TL_1$, $TL_2$, $TL_3$, $C_1$, $C_{by1}$, 23, 231, 232, 24, 241, 242, X2 and X3 in the blocks of the power divider 22 and the input impedance conversion circuit 21 are respectively replaced by reference numerals $TL_4$, $TL_5$, $TL_6$, $C_2$, $C_{by2}$, 28, 281, 282, 27, 271, 272, X4 and X5 in the blocks of the power combiner 26 and the output impedance conversion circuit 29. The first bias voltage source ($V_G$) shown in the block of the input impedance conversion circuit 21 is replaced by a second bias voltage source ($V_D$) that provides the second voltage ($V_2$) in the block of the output impedance conversion circuit 29. It is noted that, in this embodiment, the microstrip structures of the power divider 22 and the power combiner 26 are identical, but this disclosure is not limited thereto.

Accordingly, the conversion impedance ($Z_L$) may be expressed as $$Z_L = j\omega L_{TL4} + \left[\left(j\omega L_{TL5} + \frac{1}{j\omega C_{by2}}\right) \| \left(\frac{1}{j\omega C_2} + j\omega L_{TL6} + R_{0L}\right)\right] \quad (3)$$

where the parameters are defined as follows:
$\omega$: an angular frequency of the RF input signal ($RF_{in}$) or the RF output signal ($RF_{out}$),
$L_{TL4}$: inductance of the microstrip line ($TL_4$),
$L_{TL5}$: inductance of the microstrip line ($TL_5$),
$L_{TL6}$: inductance of the microstrip line ($TL_6$),
$C_2$: capacitance of the capacitor ($C_2$),
$C_{by2}$: capacitance of the bypass capacitor ($C_{by2}$), and
$R_{0L}$: impedance of the post-stage circuit 40 (e.g., 50 ohms).

It is noted that the capacitors ($C_2$), ($C_{by2}$) are selected such that $$\frac{1}{\omega C_{by2}} \approx 0 \text{ and } \frac{1}{\omega C_2} \approx 0,$$

so equation (3) may be rewritten as $$Z_L \approx R_{0L} \frac{\omega^2 L_{TL5}^2}{R_{0L}^2 + \omega^2(L_{TL5} + L_{TL6})^2} + \quad (4)$$

$$j\omega\left[L_{TL4} + \frac{R_{0L}^2 L_{TL5} + \omega^2 L_{TL5} L_{TL6}(L_{TL5} + L_{TL6})}{R_{0L}^2 + \omega^2(L_{TL5} + L_{TL6})^2}\right] \equiv R_L + j\omega L_L$$

where $R_L$ serves as a resistance that represents a real part of the conversion impedance ($Z_L$), and $L_L$ serves as an inductance that represents an imaginary part of the conversion impedance ($Z_L$).

Figure 5:
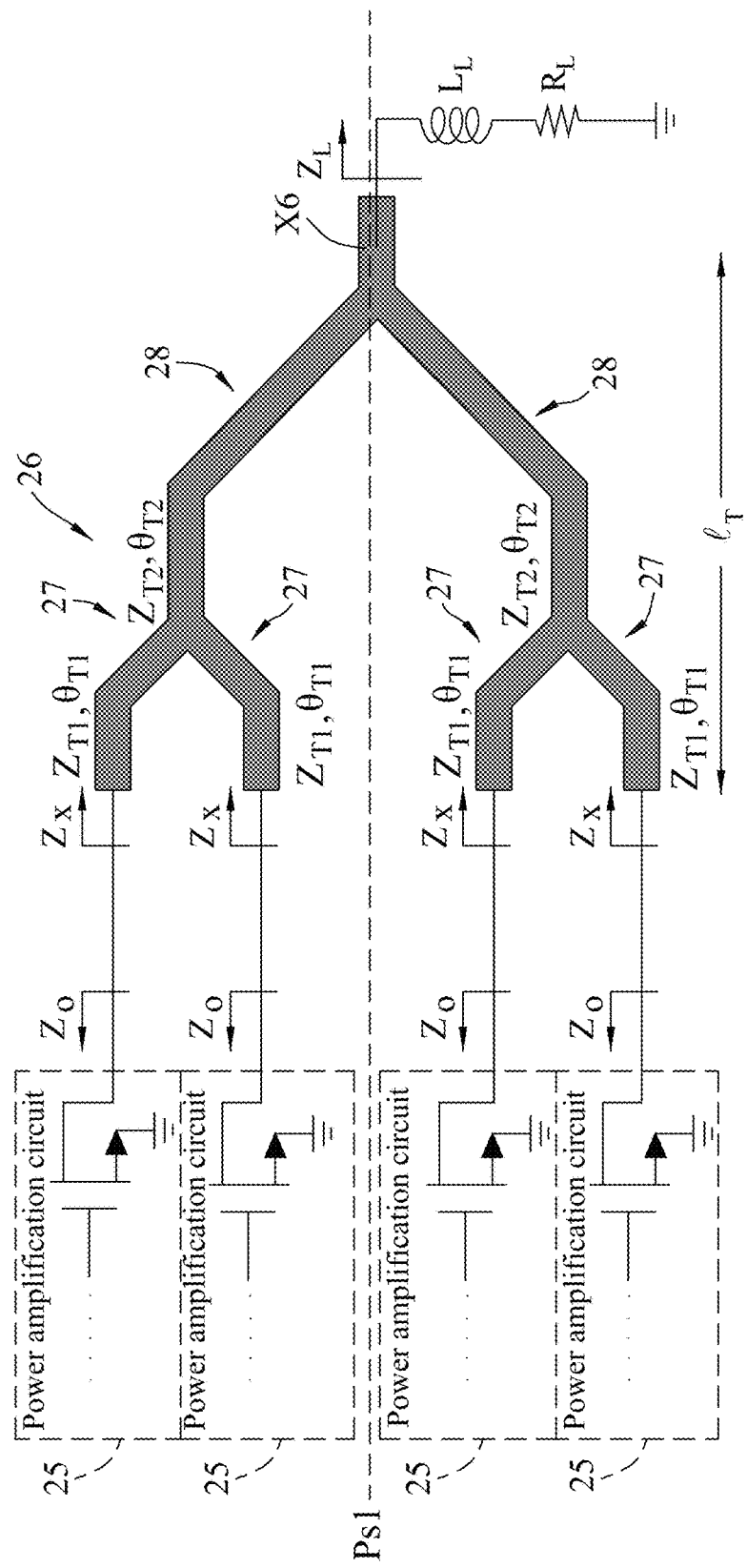
FIG. 5 is a schematic circuit diagram for assisting in illustration of the embodiment.
Figure 6:
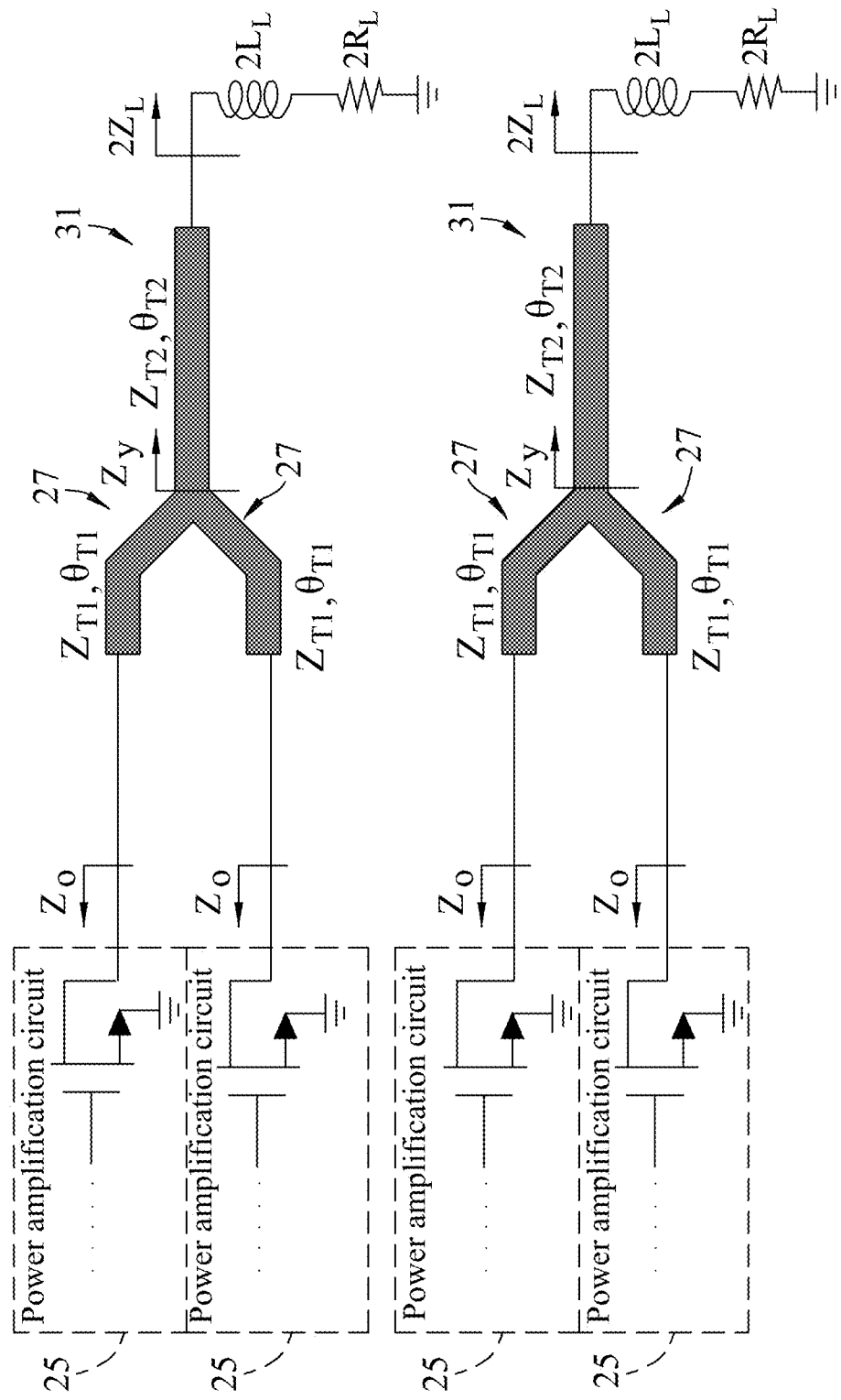
FIG. 6 is a schematic circuit diagram for assisting in illustration of the embodiment.
Figure 7:
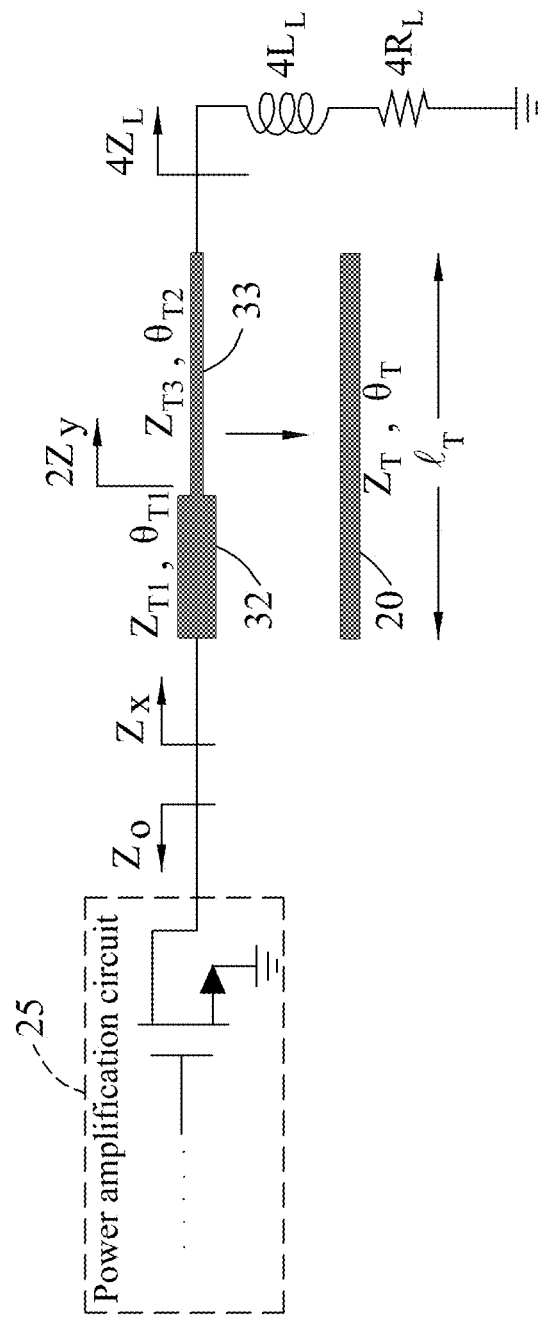
FIG. 7 is a schematic circuit diagram for assisting in illustration of the embodiment.

FIGS. 5 to 7 are used to assist in deriving a relationship among the conversion impedance ($Z_L$), an equivalent characteristic impedance ($Z_{TE}$) and an equivalent electrical length ($\theta_{TE}$) of the microstrip structure of the power combiner 26. As shown in FIG. 5, each microstrip line 27 is assumed to have a characteristic impedance ($Z_{T1}$) and an electrical length ($\theta_{T1}$), and each microstrip line 28 is assumed to have a characteristic impedance ($Z_{T2}$) and an electrical length ($\theta_{T2}$). When the amplified RF division signals (S1'-S4') satisfy a condition of common mode, the power combiner 26 may be equivalent to four microstrip branches 20 (see FIG. 7, only one is depicted) that are coupled in parallel. Each of the microstrip branches 20 has an equivalent characteristic impedance ($Z_T$) and an equivalent electrical length ($\theta_T$), which may respectively be seen as the equivalent characteristic impedance ($Z_{TE}$) and the equivalent electrical length ($\theta_{TE}$).

Referring to FIG. 5, since the microstrip structure is symmetrical with respect to a symmetric plane (Ps1), the microstrip lines 28 may be equivalent to a pair of individual microstrip lines 31 shown in FIG. 6. An input impedance ($Z_y$) of each microstrip line 31 may be expressed as $$Z_y = Z_{T2} \frac{2Z_L + jZ_{T2}\tan\theta_{T2}}{Z_{T2} + j2Z_L\tan\theta_{T2}}. \quad (5)$$

In this embodiment, the microstrip lines 28 and the microstrip lines 27 have the same width, so $Z_{T2}=Z_{T1}$, and equation (5) may be rewritten as $$2Z_y = (2Z_{T1})\frac{4Z_L + j(2Z_{T1})\tan\theta_{T2}}{(2Z_{T1}) + j4Z_L\tan\theta_{T2}}. \quad (6)$$

Furthermore, due to symmetry, for each power amplification circuit 25, the microstrip structure may be seen as a combination of a microstrip line 32 which is equivalent to the corresponding microstrip line 27, and a microstrip line 33 which is equivalent to the corresponding microstrip line 28 and which has an impedance $Z_{T3}=2Z_{T1}$, as shown in FIG. 7

Accordingly, equation (6) may be rewritten as $$2Z_y = Z_{T3}\frac{4Z_L + jZ_{T3}\tan\theta_{T2}}{Z_{T3} + j4Z_L\tan\theta_{T2}}. \quad (7)$$

In addition, an input impedance ($Z_x$) of each microstrip line (see FIG. 5), which is equivalent to the microstrip line 32 (see FIG. 7), may be expressed as $$Z_x = Z_{T1} \frac{(2Z_y) + jZ_{T1}\tan\theta_{T1}}{Z_{T1} + j(2Z_y)\tan\theta_{T1}}. \quad (8)$$

By using ABCD matrix analysis, the combination of the microstrip line 32 and the microstrip line 33 may be transferred to the microstrip branch 20, where $$Z_T = Z_{TE} = Z_{T1}\sqrt{1 + \frac{3\sin(\theta_{T1} + \theta_{T2}) + 3\sin(\theta_{T2} - \theta_{T1})}{3\sin(\theta_{T1} + \theta_{T2}) - \sin(\theta_{T2} - \theta_{T1})}}, \text{ and} \quad (9)$$

$$\theta_T = \theta_{TE} = \cos^{-1}\left[\frac{3}{4}\cos(\theta_{T1} + \theta_{T2}) + \frac{1}{4}\cos(\theta_{T2} - \theta_{T1})\right]. \quad (10)$$

An input impedance of each microstrip branch 20 is equal the input impedance ($Z_x$) of each microstrip line 27, which may be rewritten as $$Z_x = Z_T \frac{4Z_L + jZ_T\tan\theta_T}{Z_T + j4Z_L\tan\theta_T}. \quad (11)$$

Referring to FIGS. 3 and 5 again, in order to achieve maximal output power and maximal PAE, the impedance ($Z_x$) may be designed by using load-pull simulation. It is noted that the impedance ($Z_x$) usually does not form conjugate matching with the output impedance ($Z_o$) of the power amplification circuit 25. In one exemplary application where the operating frequency is at 77 GHz and the output impedance ($Z_o$) is about 44.3−j214.7Ω, the impedance ($Z_x$) based on the load-pull simulation is $Z_x$=153.2+j124.5Ω. In addition, the conversion impedance ($Z_L$) is $Z_L$=15.3+j19.3Ω in consideration of the microstrip output terminal (X6) in this exemplary application. Accordingly, a result of $Z_T$=98.8Ω and $\theta_T$=25° may be acquired by placing the values of the impedances ($Z_x$), ($Z_L$) into equation (11). In this embodiment, since the microstrip lines 27, 28 have the same width, which leads to $Z_{T1}$=$Z_{T2}$, $Z_{T3}$=2$Z_{T1}$ in FIG. 7. Then, by placing the obtained $Z_T$ and $\theta_T$ into equations (9) and (10) to form simultaneous equations and setting $Z_{T1}$ to have a reasonable value (e.g., between 0.5$Z_T$ and $Z_T$), the characteristic impedance ($Z_{T1}$) and the electrical length ($\theta_{T1}$) of each microstrip line 27, and the characteristic impedance ($Z_{T2}$) and the electrical length ($\theta_{T2}$) of each microstrip line 28 may be acquired. Simply, through design of the conversion impedance ($Z_L$) and the result of the load-pull simulation, the equivalent characteristic impedance ($Z_T$) and the equivalent electrical length ($\theta_T$) may be acquired. Then, by setting the characteristic impedance ($Z_{T1}$) to have a reasonable value, the electrical length ($\theta_{T1}$) of each microstrip line 27, and the electrical length ($\theta_{T2}$) of each microstrip line 28 may be acquired according to equations (9) and (10).

Referring to FIG. 7 again, after acquiring the equivalent electrical length ($\theta_{TE}$) of the microstrip structure of the power combiner 26 according to equation (10), the physical length ($l_T$) of the microstrip structure of the power combiner 26 may be obtained by $$\theta_{TE} = \theta_T = \frac{360°}{\lambda}\ell_T. \quad (12)$$

Accordingly, since the equivalent electrical length ($\theta_{TE}$) of the microstrip structure of the power combiner 26 is 25°, which is much smaller than that (180° (i.e., 2×90°)) required by the conventional Wilkinson power combiners, the physical length ($l_T$) (about 107.38 μm in the exemplary application) of the microstrip structure of the power combiner 26 would be much smaller than that of the conventional Wilkinson power combiners.

It is noted that, when 12Ω≤$R_L$≤30Ω and 20 pH≤$L_L$≤50 pH, the equivalent electrical length ($\theta_{TE}$) would be in a range of 8.1°≤θ$T_E$≤44.4°, so the corresponding physical length ($l_T$) of the microstrip structure of the power combiner 26 would be much smaller than that of the conventional Wilkinson power combiners.

In addition, each power amplification circuit 25 may be designed such that the input impedance ($Z_i$) thereof is approximate to the output impedance ($Z_o$) thereof (i.e., Zi≈$Z_o$), so that the power combiner 26 and the power divider 22 may have an identical structure (i.e., the corresponding parameters are identical) but used in reverse ways, thereby easing circuit design.

Figure 8:
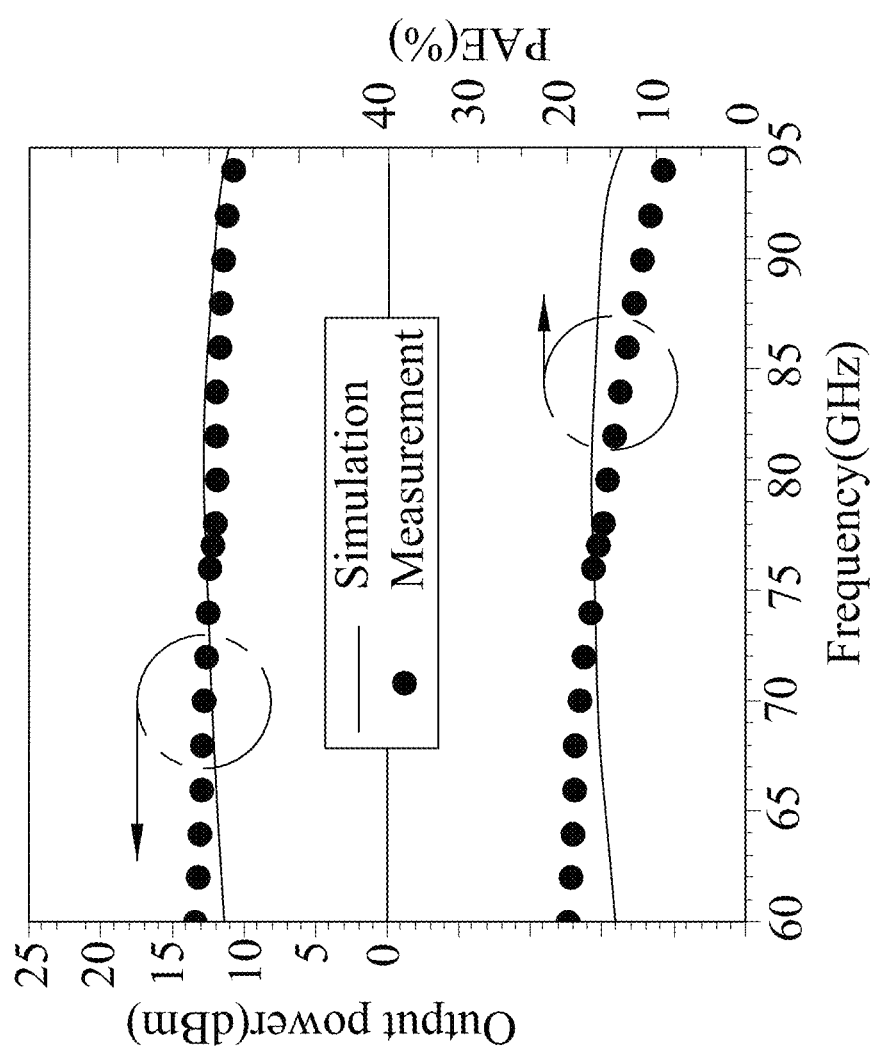
FIG. 8 is a plot illustrating output power and maximal PAE of the embodiment.

FIG. 8 shows simulation and measurement results of the RF power amplifier circuit according to this disclosure where the RF output signal ($RF_{out}$) has the output power of 12 dBm, and the maximal PAE of 16% at 77 GHz. In addition, within a frequency band of 60 GHz to 94 GHz, the RF output signal ($RF_{out}$) has the output power of between 10.6 dBm and 13.2 dBm, and the maximal PAE of between 8.9% and 19.5%. Such results show the enhanced power gain and PAE.

It is noted that, in a general form, parameters of the N-way RF power amplifier circuit of this disclosure may have the relationship of $$\theta_{TE} = \tan^{-1}\left(\frac{Nm-1}{m-1} \times \frac{Y_{TE}}{\omega L_L}\right) = \frac{2\pi}{\lambda}\ell_T \quad (13)$$

$$\text{with } m = \left|\frac{Z_L}{Z_x}\right| = \frac{\sqrt{R_L^2 + \omega^2 L_L^2}}{\sqrt{R_x^2 + \omega^2 L_x^2}} \quad (14)$$

where, for the power combiner 26, $Y_{TE}$ represents an equivalent characteristic transconductance of the microstrip structure thereof, and $R_x$ and $L_x$ respectively represent a real part and an imaginary part of the input impedance ($Z_x$) of the microstrip structure of the power combiner 26. As mentioned above, when the input impedance conversion circuit 21 and the power divider 22 combined have the same circuit structure as the output impedance conversion circuit 29 and the power combiner 26 combined but the structure is used in a reverse way, the parameters of the microstrip structure of the power divider 22 may also be acquired using equations (13) and (14) with replacement of corresponding parameters (e.g., replacing $Z_L$ with $Z_S$, etc.).

In some embodiments, the N-way RF power amplifier circuit according to this disclosure may include only one of the input impedance conversion module 21 and the output impedance conversion module 29 in order to reduce the equivalent electrical length ($\theta_{TE}$) and the physical length ($l_T$) of the microstrip structure of the corresponding power divider 22 or the power combiner 26.

In summary, the N-way RF power amplifier circuit according to this disclosure may have the following advantages:

1. Saving chip area: by design of the conversion impedance ($Z_L$) and/or the source impedance ($Z_S$), the equivalent electrical length ($\theta_{TE}$) of the microstrip structure of the corresponding power combiner 26 and/or the power divider 22 may be reduced to be much smaller than 2×λ/4 (i.e., 180°) in a case of a 4-way RF power amplifier circuit. As a result, the 4-way RF power amplifier circuit according to this disclosure may have reduced dimension in comparison to the conventional 4-way RF power amplifier circuit that uses Wilkinson power dividers/combiners each having an electrical length of λ/4 (resulting in a total electrical length of 4×λ/4), thereby saving chip area and reducing power consumption resulting from wiring.

2. Enhancing power gain and PAE: By virtue of the reduced wiring of the power combiner 26 and/or the power combiner 22, signal loss at high frequency may be reduced. In addition, the current-reuse structure of the power amplification circuits 25 may reduce the direct-current power consumption. Accordingly, power gain and PAE may thus be enhanced.

Figure 2:
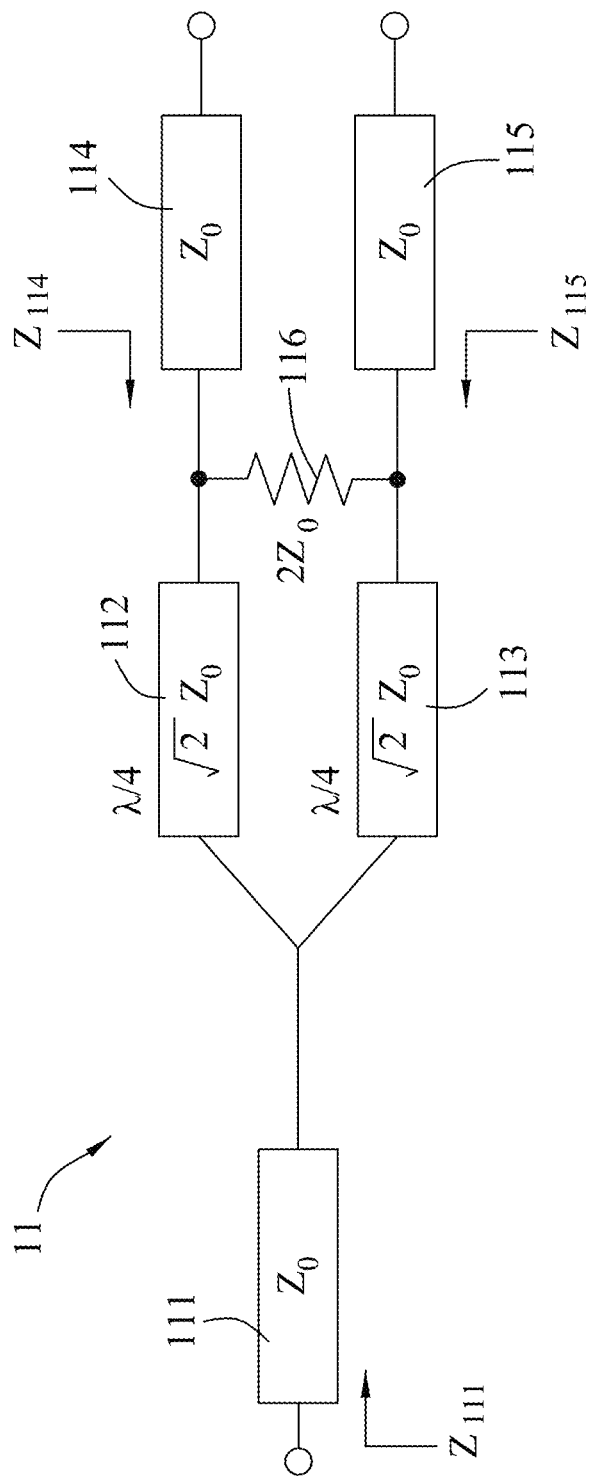
FIG. 2 is a circuit block diagram illustrating a Wilkinson power divider of the conventional 4-way power amplifier circuit.

3. Redundant resistors may be removed: Since the power divider 22 and the power combiner 26 operate in common mode (i.e., the RF division signals have the same phase for the branches of the power divider/combiner 22/26), each resistor coupled between a corresponding pair of microstrip lines in the case of the Wilkinson power dividers/combiners (see, for instance, resistor 116 in FIG. 2) is not required for the power divider 22 and the power combiner 26 in this disclosure, thereby saving material cost.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A radio frequency (RF) power amplifier circuit comprising:
   a power divider disposed to receive an RF input signal, and configured to divide the RF input signal into more than three RF division signals;
      a plurality of power amplification circuits coupled to said power divider for respectively receiving the RF division signals, each of said power amplification circuits being configured to perform power amplification on a respective one of the RF division signals, and to output a respective one of amplified RF division signals; and
      a power combiner coupled to said power amplification circuits for receiving the amplified RF division signals, and configured to combine the amplified RF division signals into an RF output signal;
   wherein one of said power divider and said power combiner has a first microstrip structure,
   said RF power amplifier circuit further comprising a first impedance conversion circuit that has
      a first terminal coupled to said one of said power divider and said power combiner that has said first microstrip structure, and
      a second terminal that is disposed to receive the RF input signal when said first terminal is coupled to said power divider, and that is disposed to output the RF output signal when said first terminal is coupled to said power combiner,
   said first impedance conversion circuit being configured to permit transmission of one of the RF input signal and the RF output signal between said first and second terminals thereof, and being configured such that a first conversion impedance, which is an impedance seen into said first impedance conversion circuit from said first terminal, matches an impedance seen into said one of said power divider and said power combiner from said first terminal; and
   wherein said first microstrip structure has a physical length associated with the first conversion impedance, said RF power amplifier circuit satisfying:

$$\theta_{TE} = \tan^{-1}\left(\frac{Nm-1}{m-1} \times \frac{Y_{TE}}{\omega L_L}\right) = \frac{2\pi}{\lambda}\lambda_T; \text{ and}$$

$$m = \left|\frac{Z_L}{Z_x}\right| = \frac{\sqrt{R_L^2 + \omega^2 L_L^2}}{\sqrt{R_x^2 + \omega^2 L_x^2}},$$

where:
N represents a number of the RF division signals,
$\theta_{TE}$ represents an equivalent electrical length of said first microstrip structure,
$Y_{TE}$ represents an equivalent characteristic transconductance of said first microstrip structure,
ω represents an angular frequency of the RF input signal,
$\lambda_T$ represents the physical length of said first microstrip structure,
$Z_L$ represents the first conversion impedance;
$R_L$ represents a real part of $Z_L$,
$L_L$ represents an imaginary part of $Z_L$,
$Z_x$ represents an impedance seen into said first microstrip structure from a terminal of said first microstrip structure to which one of said power amplification circuits is coupled,
$R_x$ represents a real part of $Z_x$,
$L_x$ represents an imaginary part of $Z_x$, and
λ represents a wavelength of the RF input signal.

2. The RF power amplifier circuit of claim 1, wherein a number of the RF division signals is $2^R$, and the physical length of said first microstrip structure is shorter than R×(λ/4), where λ represents a wavelength of the RF input signal, and R is a positive integer equal to or greater than 2.

3. The RF power amplifier circuit of claim 1, wherein: the conversion impedance has a real part that represents a resistance of $R_L$, and an imaginary part that represents an inductance of $L_L$; and, when a number of the RF division signals is four, 12Ω≤$R_L$≤30Ω and 20 pH≤$L_L$≤50 pH.

4. The RF power amplifier circuit of claim 1, wherein a number of the RF division signals is $2^R$, and said first microstrip structure includes a connection terminal coupled to said first terminal of said first impedance conversion circuit, and a number R of microstrip line groups that are respectively first to $R^{th}$ microstrip line groups, where R is a positive integer greater than or equal to 2;

said first microstrip line group includes a pair of first microstrip lines each having a first terminal, and a second terminal that is coupled to said connection terminal;

said $r^{th}$ microstrip line group includes a number $2^{r-1}$ pairs of $r^{th}$ microstrip lines, where r is a positive integer greater than one and smaller than R;

each pair of said $r^{th}$ microstrip lines corresponds to a respective one of said $(r-1)^{th}$ microstrip lines, and each of said $r^{th}$ microstrip lines has a first terminal, and a second terminal that is coupled to said first terminal of the corresponding one of said $(r-1)^{th}$ microstrip lines;

said $R^{th}$ microstrip line group includes a number $2^{R-1}$ pairs of $R^{th}$ microstrip lines, each pair of said $R^{th}$ microstrip lines corresponding to a respective one of said $(R-1)^{th}$ microstrip lines, each of said $R^{th}$ microstrip lines having a first terminal that is coupled to a respective one of said power amplification circuits, and a second terminal that is coupled to said first terminal of the corresponding one of said $(R-1)^{th}$ microstrip lines;

said first terminal of each of said $R^{th}$ microstrip lines is disposed to transmit a respective one of the RF division signals to the respective one of said power amplification circuits when said power divider has said first microstrip structure; and said first terminal of each of said $R^{th}$ microstrip lines is disposed to receive a respective one of the amplified RF division signals when said power combiner has said first microstrip structure.

5. The RF power amplifier circuit of claim 1, wherein said first impedance conversion circuit includes:

a first microstrip line having a first terminal serving as said first terminal of said first impedance conversion circuit, and a second terminal;

a second microstrip line having a first terminal coupled to said second terminal of said first microstrip line, and a second terminal disposed to receive a first voltage; and a third microstrip line and a capacitor coupled in series to form a series connection that has a first terminal coupled to said second terminal of said first microstrip line, and a second terminal serving as said second terminal of said first impedance conversion circuit.

6. The RF power amplifier circuit of claim 1, wherein said first impedance conversion circuit further includes a bypass capacitor to couple said second terminal of said second microstrip line to a reference node.

7. The RF power amplifier circuit of claim 1, wherein said power combiner has said first microstrip structure.

8. The RF power amplifier circuit of claim 7, wherein said power divider has a second microstrip structure, said RF power amplifier circuit further comprising a second impedance conversion circuit that has a first terminal coupled to said power divider, and a second terminal that is disposed to receive the RF input signal, said second impedance conversion circuit being configured to permit transmission of the RF input signal between said first and second terminals thereof, and being configured such that a second conversion impedance, which is an impedance seen into said second impedance conversion circuit from said first terminal of said second impedance conversion circuit, matches an impedance seen into said power divider from said first terminal of said second impedance conversion circuit;

wherein said second microstrip structure has a physical length associated with the second conversion impedance.

9. The RF power amplifier circuit of claim 1, wherein said power divider has said first microstrip structure.

10. A radio frequency (RF) power amplifier circuit comprising:

a power divider disposed to receive an RF input signal, and configured to divide the RF input signal into more than three RF division signals;

a plurality of power amplification circuits coupled to said power divider for respectively receiving the RF division signals, each of said power amplification circuits being configured to perform power amplification on a respective one of the RF division signals, and to output a respective one of amplified RF division signals; and a power combiner coupled to said power amplification circuits for receiving the amplified RF division signals, and configured to combine the amplified RF division signals into an RF output signal;

wherein one of said power divider and said power combiner has a first microstrip structure, said RF power amplifier circuit further comprising a first impedance conversion circuit that has a first terminal coupled to said one of said power divider and said power combiner that has said first microstrip structure, and a second terminal that is disposed to receive the RF input signal when said first terminal is coupled to said power divider, and that is disposed to output the RF output signal when said first terminal is coupled to said power combiner, said first impedance conversion circuit being configured to permit transmission of one of the RF input signal and the RF output signal between said first and second terminals thereof, and being configured such that a first conversion impedance, which is an impedance seen into said first impedance conversion circuit from said first terminal, matches an impedance seen into said one of said power divider and said power combiner from said first terminal;

wherein said first microstrip structure has a physical length associated with the first conversion impedance;

wherein a number of the RF division signals is 4, and said first microstrip structure includes a connection terminal coupled to said first terminal of said first impedance conversion circuit, a first microstrip line group and a second microstrip line group;

said first microstrip line group includes a pair of first microstrip lines each having a first terminal, and a second terminal that is coupled to said connection terminal;

said second microstrip line group includes two pairs of second microstrip lines, each pair of said second microstrip lines corresponds to a respective one of said first microstrip lines, and each of said second microstrip lines has a first terminal that is coupled to a respective one of said power amplification circuits, and a second terminal that is coupled to said first terminal of the corresponding one of said first microstrip lines;

said first terminal of each of said second microstrip lines is disposed to transmit a respective one of the RF division signals to the respective one of said power amplification circuits when said power divider has said first microstrip structure; and said first terminal of each of said second microstrip lines is disposed to receive a respective one of the amplified RF division signals when said power combiner has said first microstrip structure; and wherein each of said first microstrip lines has a first electrical length, each of said second microstrip lines has a second electrical length, and said RF power amplifier circuit satisfies:

$$\theta_{TE} = \cos^{-1}\left[\frac{3}{4}\cos(\theta_{T1} + \theta_{T2}) + \frac{1}{4}\cos(\theta_{T2} - \theta_{T1})\right],$$

where $\theta_{TE}$ represents an equivalent electrical length of said first microstrip structure, $\theta_{T1}$ represents the first electrical length, and $\theta_{T2}$ represents the second electrical length.

11. The RF power amplifier circuit of claim 10, wherein each of said first microstrip lines has a first characteristic impedance, each of said second microstrip lines has a second characteristic impedance, and said RF power amplifier circuit satisfies:

$$Z_{TE} = Z_{T1}\sqrt{1 + \frac{3\sin(\theta_{T1} + \theta_{T2}) + 3\sin(\theta_{T2} - \theta_{T1})}{3\sin(\theta_{T1} + \theta_{T2}) - \sin(\theta_{T2} - \theta_{T1})}} \; ; \text{and}$$

$$Z_{T2} = Z_{T1},$$

where $Z_{TE}$ represents an equivalent characteristic impedance of said first microstrip structure, $Z_{T1}$ represents the first characteristic impedance, and $Z_{T2}$ represents the second characteristic impedance.

12. A radio frequency (RF) power amplifier circuit comprising:
- a power divider disposed to receive an RF input signal, and configured to divide the RF input signal into more than three RF division signals;
  - a plurality of power amplification circuits coupled to said power divider for respectively receiving the RF division signals, each of said power amplification circuits being configured to perform power amplification on a respective one of the RF division signals, and to output a respective one of amplified RF division signals; and
  - a power combiner coupled to said power amplification circuits for receiving the amplified RF division signals, and configured to combine the amplified RF division signals into an RF output signal;
  - wherein one of said power divider and said power combiner has a first microstrip structure, said RF power amplifier circuit further comprising a first impedance conversion circuit that has
- a first terminal coupled to said one of said power divider and said power combiner that has said first microstrip structure, and
- a second terminal that is disposed to receive the RF input signal when said first terminal is coupled to said power divider, and that is disposed to output the RF output signal when said first terminal is coupled to said power combiner, said first impedance conversion circuit being configured to permit transmission of one of the RF input signal and the RF output signal between said first and second terminals thereof, and being configured such that a first conversion impedance, which is an impedance seen into said first impedance conversion circuit from said first terminal, matches an impedance seen into said one of said power divider and said power combiner from said first terminal;

wherein said first microstrip structure has a physical length associated with the first conversion impedance; and wherein each of said power amplification circuits includes:
- a first transistor having a first terminal, a second terminal to be coupled to a reference node, and a control terminal;
- a first inductor having a first terminal coupled to said power divider for receiving therefrom the respective one of the RF division signals, and a second terminal coupled to said control terminal of said first transistor;
- a first resistor and a first capacitor coupled in series between said first terminals of said first inductor and said first transistor;
- a second transistor having a first terminal coupled to said power combiner for providing thereto the respective one of the RF division signals after amplification, a second terminal, and a control terminal;
- a second inductor having a first terminal, and second terminal coupled to said control terminal of said second transistor;
- a second capacitor coupled between said first terminals of said second inductor and said first transistor;
- a third inductor coupled between said first terminal of said first transistor and said second terminal of said second transistor;
- a second resistor coupled between said first terminals of said second inductor and said second transistor; and
- a third capacitor to couple said second terminal of said second transistor to the reference node.

* * * * *